United States Patent
Kalden (10) Patent No.: US 10,809,630 B2
(45) Date of Patent: Oct. 20, 2020

(54) METHOD FOR CORRECTING A REFLECTIVE OPTICAL ELEMENT FOR THE WAVELENGTH RANGE BETWEEN 5 NM AND 20 NM

(71) Applicant: Carl Zeiss SMT GmbH, Oberkochen (DE)

(72) Inventor: Joachim Kalden, Essingen (DE)

(73) Assignee: CARL ZEISS SMT GMBH, Oberkochen (DE)

(*) Notice: Subject to any disclaimer, the term of this patent is extended or adjusted under 35 U.S.C. 154(b) by 0 days.

(21) Appl. No.: 16/550,415

(22) Filed: Aug. 26, 2019

(65) Prior Publication Data

US 2019/0377268 A1 Dec. 12, 2019

Related U.S. Application Data

(63) Continuation of application No. PCT/EP2018/054769, filed on Feb. 27, 2018.

(30) Foreign Application Priority Data

Feb. 28, 2017 (DE) .................. 10 2017 203 246

(51) Int. Cl.
*G03F 7/20* (2006.01)

(52) U.S. Cl.
CPC ........ *G03F 7/70591* (2013.01); *G03F 7/7015* (2013.01); *G03F 7/70258* (2013.01); *G03F 7/70316* (2013.01)

(58) Field of Classification Search
CPC ............. G03F 7/70258; G03F 7/70316; G03F 7/7015; G03F 7/70033; G03F 7/70591;
(Continued)

(56) References Cited

U.S. PATENT DOCUMENTS

2002/0122989 A1 9/2002 Stearns et al.
2003/0081722 A1 5/2003 Kandaka et al.
(Continued)

FOREIGN PATENT DOCUMENTS

DE 102014225197 A1 11/2005
DE 102008041144 A1 3/2009
(Continued)

OTHER PUBLICATIONS

Volkert et al., "Focused Ion Beam Microscopy and Micromachining", MRS Bulletin, vol. 32, May 2007, pp. 389-399.
(Continued)

*Primary Examiner* — Christina A Riddle
(74) *Attorney, Agent, or Firm* — Edell, Shapiro & Finnan, LLC (57) ABSTRACT

A method for correcting a reflective optical element for the wavelength range between 5 nm and 20 nm, which includes a multilayer system on a substrate. The multilayer system has layers consisting of at least two alternately arranged different materials with a different real component of the refractive index for a wavelength in the extreme ultraviolet wavelength range. The method includes: measuring the reflectivity distribution over the surface of the multilayer system; comparing the measured reflectivity distribution to a nominal distribution of the reflectivity over the surface of the multilayer system, determining at least one partial surface having a measured reflectivity above the nominal reflectivity; and irradiating the at least one partial surface with ions or electrons.

13 Claims, 6 Drawing Sheets

(58) Field of Classification Search
CPC .. G03F 7/70308; G03F 7/70191; G03F 7/702; G03F 7/70225; G03F 7/70233; G03F 7/7055; G03F 7/70583; G03F 7/70558; G03F 7/706; G03F 7/7095; G03F 7/70958; G03F 7/70983; G03F 1/72; G03F 1/74; G02B 5/0891; G02B 5/0816; G02B 1/12; G21K 1/062; G01M 11/005; G12K 2201/067; G01B 11/30
USPC .......... 355/30, 52–55, 66–71, 77; 250/492.1, 250/492.2, 492.21, 492.22, 492.3, 493.1, 250/503.1, 504 R; 378/34, 35
See application file for complete search history.

(56) References Cited

U.S. PATENT DOCUMENTS

| | | | |
|---|---|---|---|
| 2004/0245090 A1* | 12/2004 | Yakshin | B82Y 10/00 204/192.1 |
| 2006/0222961 A1 | 10/2006 | Yan | |
| 2008/0165925 A1 | 7/2008 | Singer et al. | |
| 2009/0002662 A1* | 1/2009 | Komatsuda | G02B 27/0927 355/67 |
| 2012/0327384 A1 | 12/2012 | Clauss | |
| 2014/0017601 A1* | 1/2014 | Mikami | G03F 1/24 430/5 |
| 2014/0307308 A1* | 10/2014 | Weiss | G03F 7/70591 359/355 |
| 2018/0059413 A1 | 3/2018 | Banyay et al. | |

FOREIGN PATENT DOCUMENTS

| | | |
|---|---|---|
| DE | 102009055119 A1 | 8/2011 |
| DE | 102011084117 A1 | 4/2013 |
| DE | 102014225197 A1 | 11/2015 |
| DE | 102016217694 A1 | 11/2016 |
| EP | 1349009 A2 | 10/2003 |
| WO | 2004057378 A1 | 7/2004 |
| WO | 2013117343 A1 | 8/2013 |
| WO | 2016042549 A2 | 3/2016 |

OTHER PUBLICATIONS

German Office Action with English translation, Application No. 102017203246.4, dated Dec. 10, 2017, 13 pages.
International Preliminary Report on Patentability, PCT/EP2018/054769, dated Sep. 3, 2019, 7 pages.
International Search Report, PCT/EP2018/054769, dated May 15, 2018, 4 pages.

* cited by examiner

METHOD FOR CORRECTING A REFLECTIVE OPTICAL ELEMENT FOR THE WAVELENGTH RANGE BETWEEN 5 NM AND 20 NM

CROSS REFERENCE TO RELATED APPLICATIONS

This is a Continuation of International Application PCT/EP2018/054769, which has an international filing date of Feb. 27, 2018, and which claims the priority of German Patent Application 10 2017 203 246.4, filed Feb. 28, 2017. The disclosures of both applications are incorporated in their respective entireties into the present Continuation by reference.

FIELD OF THE INVENTION

The present invention relates to a method for correcting a reflective optical element for the wavelength range from 5 nm to 20 nm, having a multilayer system on a substrate, wherein the multilayer system has layers made from at least two different materials having mutually differing real parts of the refractive index at a wavelength in the extreme ultraviolet wavelength range, which are arranged alternately. The present invention additionally relates to a reflective optical element for the wavelength range from 5 nm to 20 nm, having a multilayer system on a substrate, wherein the multilayer system has layers made from at least two different materials having mutually differing real parts of the refractive index at a wavelength in the extreme ultraviolet wavelength range, which are arranged alternately. The invention furthermore relates to an optical system and to an EUV lithography apparatus.

BACKGROUND

In EUV lithography apparatuses, reflective optical elements for the extreme ultraviolet (EUV) wavelength range (e.g. wavelengths of between approximately 5 nm and 20 nm) such as, for instance masks or mirrors on the basis of multilayer systems are used for the lithography of semiconductor components. Since EUV lithography apparatuses generally have a plurality of reflective optical elements, they must have as high a reflectivity as possible to ensure sufficiently high overall reflectivity.

The distribution of the reflectivity over the surface of a multilayer system of a reflective optical element can influence the imaging properties of an optical system with such a reflective optical element, for example the apodization and the wavefront. Frequently of interest is a particularly high homogeneity of the reflected radiation. It may possibly be necessary to correct one or more EUV mirrors or the mask, for example to attain increased homogeneity of the radiation made available by the optical system. Comparable optical systems are used not only in EUV lithography, but also in devices for mask or wafer inspection.

It is known from US 2002/0122989 A1, in connection with the production of masks for EUV lithography, to locally decrease the reflectivity of a multilayer system on a mask by irradiation with, in particular, focused electron beams. In particular, in multilayer systems based on molybdenum and silicon, energy is introduced into the multilayer system by the electron beam, resulting in a contraction of the layer thicknesses that is proportional to the energy dose and is based on the formation of molybdenum disilicide.

SUMMARY

It is an object of the present invention to propose a way of correcting EUV mirrors.

This object is achieved, according to one formulation of the invention, by a method for correcting a reflective optical element for the wavelength range from 5 nm to 20 nm, having a multilayer system on a substrate, wherein the multilayer system has layers made from at least two different materials having mutually differing real parts of the refractive index at a wavelength in the extreme ultraviolet wavelength range, which are arranged alternately, which method includes:

measuring the reflectivity distribution over the surface of the multilayer system;

comparing the measured reflectivity distribution with a target distribution of the reflectivity over the surface of the multilayer system and determining one or more partial surfaces having a measured reflectivity that lies above the target reflectivity; and irradiating the one or more partial surfaces with ions or electrons.

The reflectivity of a multilayer system designed for EUV radiation is ensured by an alternating sequence of the materials, which is dependent highly sensitively on the respective layer thicknesses and the interfaces between the layers. It is possible to locally change the structure by irradiating the multilayer system such that the precise periodicity is lost and consequently the reflectivity is reduced at that point.

One advantage of the proposed procedure is that a mirror or a mask that is already present in an optical system can be checked and possibly be locally irradiated. Depending on the design of the optical system, the irradiation can also take place in situ, maybe even during operation thereof. The proposed procedure can likewise be used in devices for inspecting masks and mask blanks. Mirrors can also be corrected as proposed outside an optical system.

Fluctuations of the reflected intensity over the surface can be based among other things on fluctuations of the incident radiation. This can be counteracted by ascertaining a target distribution of the reflectivity in which the intensity fluctuations of the incident radiation are at least partly compensated. If a sufficiently homogeneous incident radiation intensity can be assumed or the existing intensity distribution over the surface is to be prevented from changing too much on account of reflection at an EUV mirror or another reflective optical element, a relatively constant target distribution can be assumed, advantageously one that does not fluctuate by more than 1%, preferably no more than 0.5%, with particular preference no more than 0.1%, around an average. Accordingly, it is possible to select a target distribution for compensating fluctuations of the incident radiation such that the intensity distribution over the surface of the reflected radiation does not fluctuate by more than 1%, preferably no more than 0.5%, with particular preference no more than 0.1%, around an average. Depending on the application that is intended, any desired target distributions can be selected. Using the proposed procedure, the actual reflectivity can be locally reduced to approximate the target reflectivity at said point.

Advantageously, the energy of the ions or electrons during irradiation is selected such that it lies below the sputter limit or the compacting limit, preferably below both the sputter limit and the compacting limit. Removal of material of the multilayer system could lead to undesirable changes in optical properties of the reflective optical element and to an uncontrolled reduction in the reflectivity at the irradiated point. The sputtered material could also result in undesirable contamination of adjacent partial surfaces on the surface of the reflective optical element. Compacting could change the optical properties of the reflective optical element.

Advantageously, a pulsed ion or electron beam is used for the irradiation. In this way, the energy dose introduced can be controlled better. In particular, it is thus more easily possible to ensure that the energy introduction is sufficient to change the structure in the multilayer system at the atomic level, in particular the sharpness of the interfaces between the individual layers, without however promoting any chemical reactions that would lead to a contraction or expansion of the multilayer system and could thereby change the optical properties of the mirror.

Preferably, gallium, indium, bismuth, tin or gold ions are used for the irradiation. In particular, it is possible to provide focused ion beams with these ions. Gallium especially is particularly suited because it exhibits a low melting temperature and a low gas pressure, which means that gallium ion beams are controllable particularly well.

In a further aspect, the object is achieved by a reflective optical element for the wavelength range from 5 nm to 20 nm, having a multilayer system on a substrate, wherein the multilayer system has layers made from at least two different materials having a different real part of the refractive index at a wavelength in the extreme ultraviolet wavelength range, which are arranged alternately, said reflective optical element having been produced or corrected according to the method explained above.

In preferred embodiments, the reflective optical element is embodied in the form of a mirror, a mask blank or a mask. A reflective optical element with the construction of a mirror can serve as a mask blank. For example, the reflective surface of the mask blank can be structured by the application of an absorbing layer to obtain a mask in this way. A frequently used parameter for describing the mask structure is for example the geometric width of a line, described as "critical dimension" or CD.

In a further aspect, the object is achieved by an optical system with a reflective optical element as described or corrected as explained further above. Such optical systems can be used for example in EUV lithography apparatuses or in inspection systems for wafers or masks.

The object is furthermore achieved by an EUV lithography apparatus having such an optical system having a reflective optical element as described and an EUV radiation source, wherein the radiation of the EUV radiation source is incident on the mirror with an intensity that varies over the surface of the multilayer system of the mirror and wherein the one or more partial surfaces with a root-mean-squared roughness of over 0.25 nm lie in surface areas of a higher intensity. The root-mean-squared (RMS) roughness is calculated from the average of the squares of the deviation of the measurement points over the surface with respect to an average area that is placed through the surface such that the sum of all deviations with respect to the average area is minimal. In particular for optical elements for EUV lithography, the roughness in a spatial frequency range of 0.1 μm to 200 μm is of particular importance because roughness in this range leads to increased scattered radiation, which reduces reflectivity.

In addition, the object is achieved by an EUV lithography apparatus having such an optical system having a reflective optical element that was corrected as explained further above and an EUV radiation source, wherein the radiation of the EUV radiation source is incident on the mirror with an intensity that varies over the surface of the multilayer system of the reflective optical element and wherein the one or more partial surfaces irradiated with ions or electrons lie in surface areas of a higher intensity.

It has been found that the uniformity of the lighting of the radiation field used for the lithography process is typically limited by the optical systems of an EUV lithography apparatus having a lower transmittance at the edge of the radiation field than in the field centre. It is therefore particularly advantageous to provide one or more reflective optical elements that in areas of high incident intensity, such as the field centre, have a somewhat reduced reflectivity or were corrected in that respect.

BRIEF DESCRIPTION OF THE DRAWINGS

The present invention will be explained in greater detail with reference to one preferred exemplary embodiment. In the Figures.

DETAILED DESCRIPTION

Figure 1:
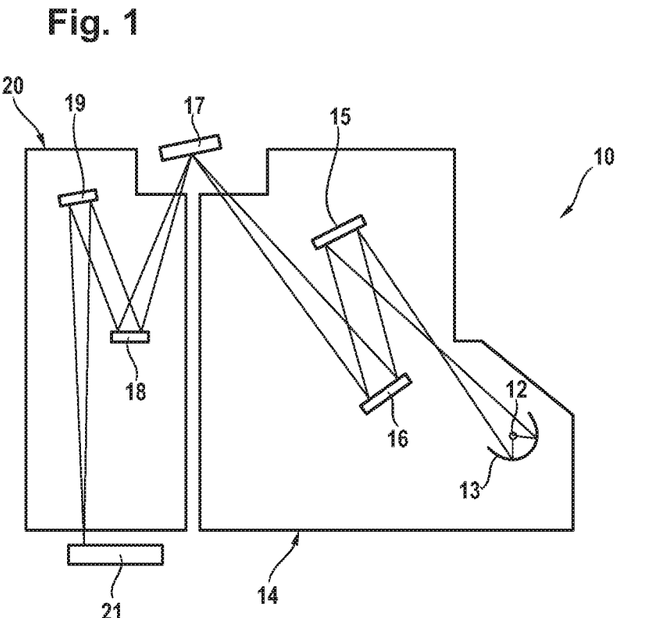
FIG. 1 schematically shows an EUV lithography apparatus.

FIG. 1 schematically shows an EUV lithography apparatus 10 in exemplary fashion. Essential components are the illumination system 14, the mask 17 and the projection system 20. The EUV lithography apparatus 10 is operated under vacuum conditions so that the EUV radiation in the interior thereof is absorbed as little as possible.

A plasma source or a synchrotron can serve for example as the radiation source 12. In the example illustrated here, a laser-operated plasma source is used. The emitted radiation in the wavelength range of approximately 5 nm to 20 nm is firstly focused by the collector mirror 13. The operating beam 11 is then introduced onto the reflective optical elements in the illumination system 14 that follow in the beam path. In the example illustrated in FIG. 1, the illumination system 14 has two further mirrors 15, 16. The mirrors 15, 16 guide the beam onto the mask 17 having the structure which is intended to be imaged onto the wafer 21. The mask 17 is likewise a reflective optical element for the EUV wavelength range, which can be exchanged depending on the lithography process. With the aid of the projection system 20, the beam reflected from the mask 17 is projected onto the wafer 21 and the structure of the mask is thereby imaged onto said wafer. In the example illustrated, the projection system 20 has two mirrors 18, 19. It should be pointed out that both the projection system 20 and the illumination system 14 can each have just one or have three, four, five or more mirrors.

Each of the mirrors 13, 15, 16, 18, 19 illustrated here and the mask 17 can have a multilayer system on a substrate, wherein the multilayer system has layers made from at least two different materials having a different real part of the refractive index at a wavelength in the extreme ultraviolet wavelength range, which are arranged alternately, and can be corrected with the following steps:

measuring the reflectivity distribution over the surface of the multilayer system;

comparing the measured reflectivity distribution with a target distribution of the reflectivity over the surface of the multilayer system and determining one or more partial surfaces having a measured reflectivity that lies above the target reflectivity; and irradiating the one or more partial surfaces with ions or electrons.

Figure 2:
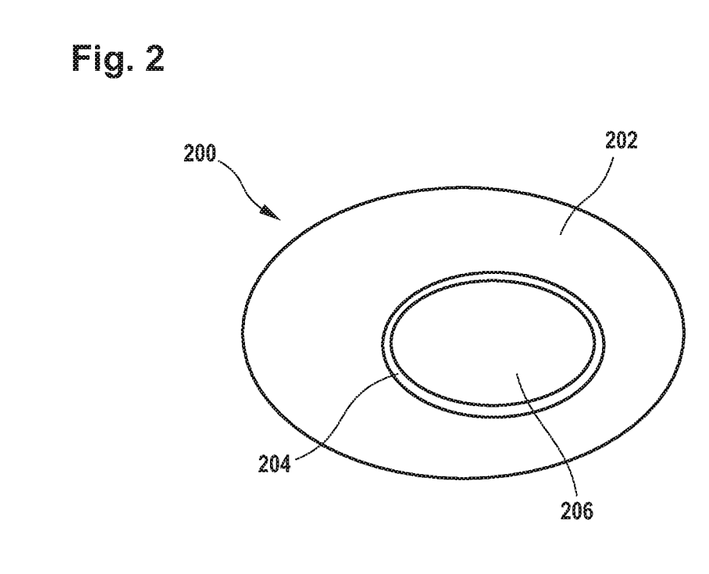
FIG. 2 shows a schematic plan view of an illuminated EUV mirror.

It is particularly advantageous, when a mirror 200 of an optical system of an EUV lithography apparatus is corrected, on which the radiation of the EUV radiation source with an intensity varying over the surface 202 of the multilayer system of the mirror 200 is incident. In FIG. 2, an area 204 of the surface 202 of the multilayer system is drawn, on which the incident radiation with an intensity over a threshold value, such as the average, is incident. To reduce the reflectivity of the mirror 200 in said area 204, the partial surface 206 was irradiated with electrons or preferably ions. By irradiating in this way, the periodicity of the multilayer system was disturbed, reducing the reflectivity in the area of the partial surface. In particular, the interfaces between the individual layers or the surface of the multilayer system was roughened to an RMS roughness of over 0.25 nm, which results in stronger scattered radiation and correspondingly reduced reflectivity. It should be pointed out that in the example shown here, the area 204 of increased intensity completely encompasses the irradiated partial surface 206 and is somewhat larger. In further embodiments, the situation may also be reversed, or the area 204 and the partial surface 206 can be identical or only partially overlap one another. What was said in connection with the mirror 200 likewise applies to masks and mask blanks.

Figure 3:
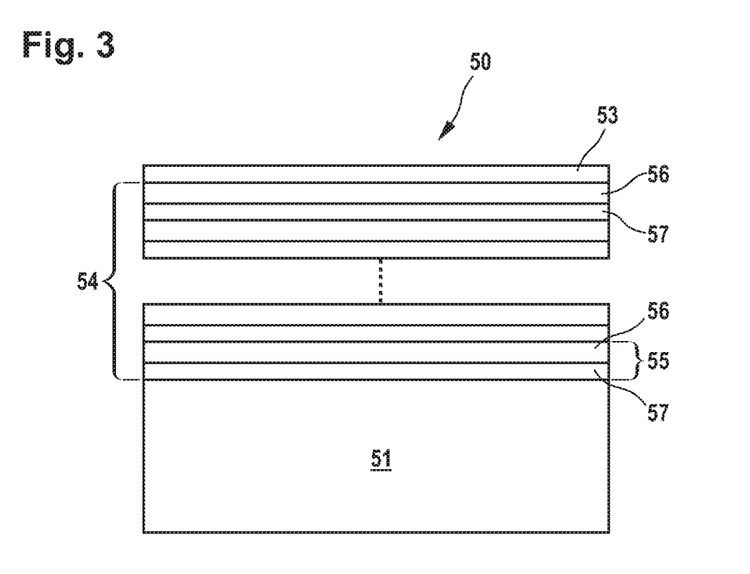
FIG. 3 schematically shows the composition of an EUV mirror having a multilayer system.

FIG. 3 schematically illustrates the construction of an EUV mirror 50, the reflective coating of which is based on a multilayer system 54. This involves layers, applied in alternation on a substrate 51, of a material having a higher real part of the refractive index at the working wavelength at which for example the lithographic exposure is carried out (also called spacer 56) and of a material having a lower real part of the refractive index at the working wavelength (also called absorber 57), wherein an absorber-spacer pair forms a stack 55. To some degree, this simulates a crystal, the lattice planes of which correspond to the absorber layers where Bragg reflection takes place. Typically, reflective optical elements for an EUV lithography apparatus or an optical system are designed such that the respective wavelength of maximum reflectivity substantially coincides with the working wavelength of the lithography process or other applications of the optical system.

The thicknesses of the individual layers 56, 57 and also of the repeating stacks 55 can be constant over the entire multilayer system 54 or vary over the surface or the total thickness of the multilayer system 54 depending on what spectral or angle-dependent reflection profile or what maximum reflectivity at the working wavelength is intended to be achieved. The reflection profile can also be influenced in a controlled manner in that the basic structure composed of absorber 57 and spacer 56 is supplemented by further more and less absorbent materials in order to increase the possible maximum reflectivity at the respective working wavelength. To that end, in some stacks absorber and/or spacer materials can be mutually interchanged or the stacks can be constructed from more than one absorber and/or spacer material.

Furthermore, it is also possible to provide additional layers as diffusion barriers between spacer and absorber layers 56, 57. A material combination that is customary for example for a working wavelength of 13.4 nm is molybdenum as absorber material and silicon as spacer material. In this case, a stack 55 often has a thickness of approximately 6.7 nm, wherein the spacer layer 56 is usually thicker than the absorber layer 57. Further typical material combinations are, among others, silicon-ruthenium or molybdenum-beryllium. In addition, a protective layer 43, possibly also of multilayer design, can be provided on the multilayer system 54.

Typical substrate materials for reflective optical elements for EUV lithography, in particular collector mirrors, are silicon, silicon carbide, silicon-infiltrated silicon carbide, quartz glass, titanium-doped quartz glass, glass and glass ceramic. Furthermore, the substrate can also be composed of copper, aluminium, a copper alloy, an aluminium alloy or a copper-aluminium alloy. Particularly preferred for mirrors, masks and mask blanks are substrate materials having a low coefficient of thermal expansion.

Figure 4:
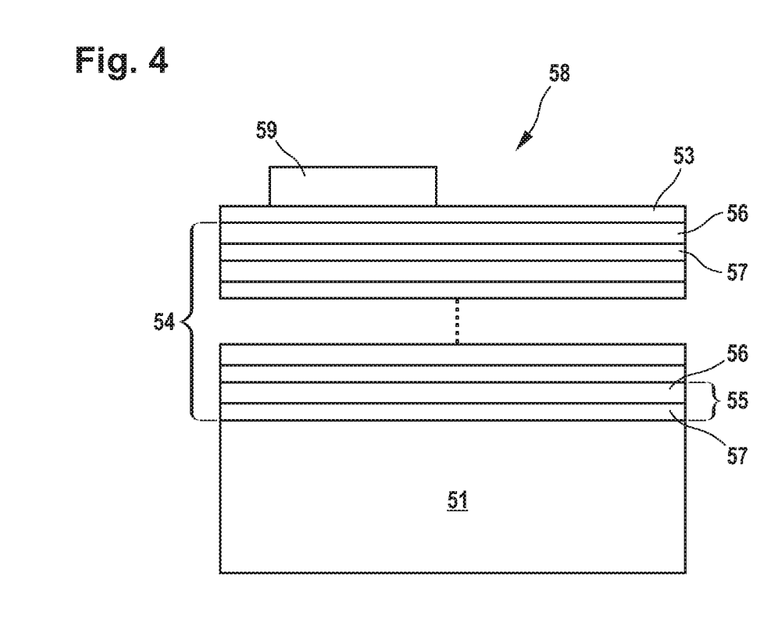
FIG. 4 schematically shows the composition of a mask having a multilayer system.

A mirror with the composition just described can also be used as a mask blank for producing a mask. A corresponding mask 59 is illustrated schematically in FIG. 4. The mask 59 differs from the mirror 50 of FIG. 3 in that an absorbing layer 58 is provided on the optional protective layer 53 of the multilayer system 54. The absorbing layer 58 absorbs a large portion of the incident EUV radiation, which means that significantly less EUV radiation is reflected in this surface area and photoresist that is located on a wafer in the corresponding surface area is not exposed. Suitable materials for the absorbing layer 58 can be, for example, aluminium, aluminium-copper alloy, chromium, tantalum, titanium, tungsten, nickel silicide, tantalum boride, tantalum nitride, tantalum silicide, tantalum silicon nitride, titanium nitride, among others. It is also possible to provide a multilayer absorbing layer. A mask blank can be corrected as proposed before an absorbing layer is applied or, in the case of a mask, the partial surfaces that are not provided with an absorbing layer.

Figure 5:
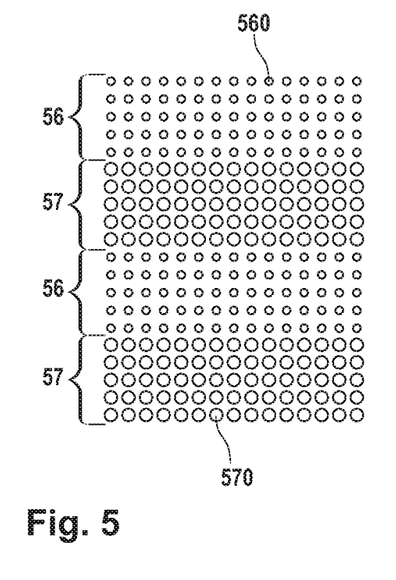
FIG. 5 schematically shows the structure of a multilayer system.

FIG. 5 illustrates the structure of a multilayer system before irradiation schematically for two spacer layers 56 and two absorber layers 57. Without loss of generality, the spacer material in the present example is silicon, indicated by silicon atoms 560, and the absorber material is molybdenum, indicated by molybdenum atoms 570. In the non-irradiated state, the arrangement of the silicon atoms 560 and the molybdenum atoms 570 has a high regularity in the respective layers 56, 57 thereof, which manifests in a high periodicity of the multilayer system and a high reflectivity.

Figure 6:
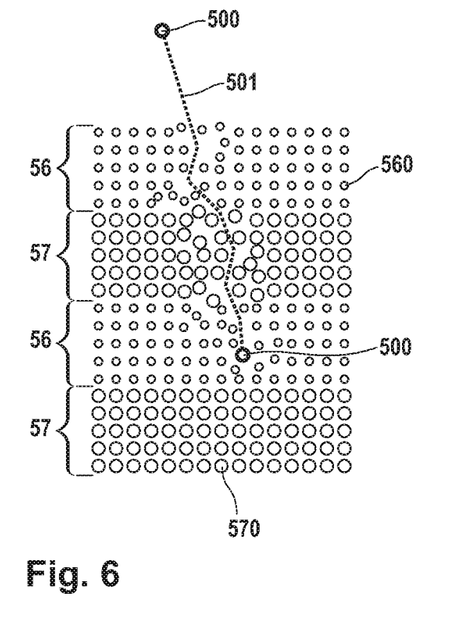
FIG. 6 schematically shows the structure of the multilayer system of FIG. 5 after an ion has entered it.

FIG. 6 schematically indicates the influence of a gallium ion 500 on the arrangement of the silicon atoms 560 and the molybdenum atoms 570 in the respective layers 56, 57 thereof. The gallium ion 500 is inelastically scattered repeatedly at various atoms 560, 570 along its trajectory 501 until the gallium ion 500 is stuck inside the multilayer system. The penetration depth is, depending on the energy of the gallium ion, between a few nanometers to a few 10s of nanometers. The atoms 560, 570 along the trajectory 501 at which the gallium ion 500 was inelastically scattered are themselves scattered inelastically at adjacent atoms 560, 570, reducing the orderliness of the atoms 560, 570. In particular, the interfaces between individual layers 56, 57 are roughened. Depending on the number of gallium ions, the root-mean-squared roughness in the area of the partial surface irradiated with ions can be over 0.25 nm or over 0.35 nm or even over 0.5 nm.

In particular in the case of mirrors or for use with irradiation that is already pretty homogeneous or in the case of masks, the correction can result in a fluctuation in the reflectivity thereof at a wavelength of the highest reflectivity in the wavelength range from 5 nm to 20 nm over the surface of the multilayer system by no more than 1% around an average.

In addition to the increased roughness, it is possible in dependence on the number or concentration of the ions for the presence thereof to change the real part and the imaginary part of the refractive index of the spacer or the absorber layer, such that the optical contrast between spacer and absorber layers can be reduced, which likewise results in a reduced reflectivity.

Figure 7:
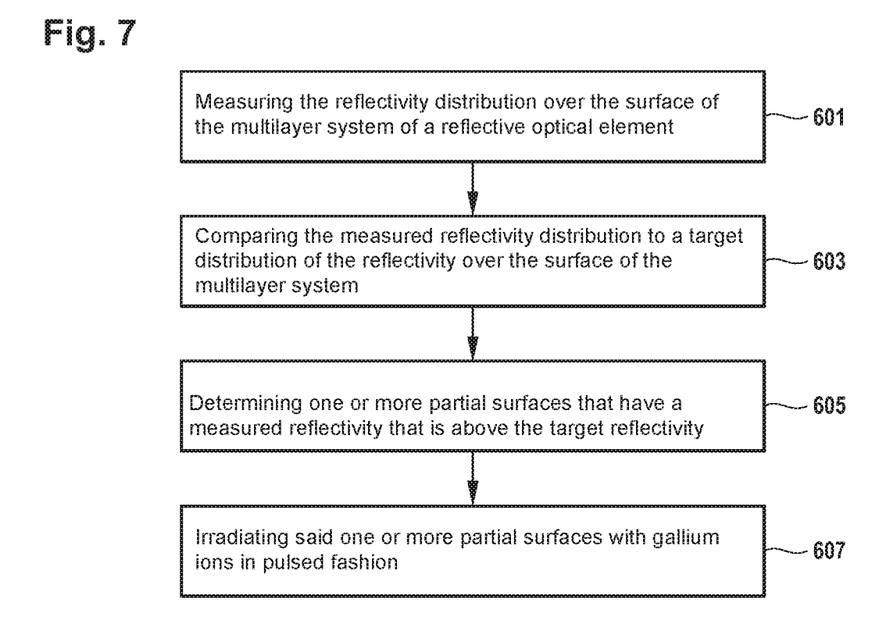
FIG. 7 schematically shows the process of an exemplary performance of the proposed correction method.

FIG. 7 shows, by way of example, the process of an embodiment of the correction method proposed here. In a first step 601, the reflectivity distribution over the surface of the multilayer system of an EUV mirror, a mask or a mask blank is measured. These optical elements are in each case a reflective optical element for the wavelength range from 5 nm to 20 nm, having a multilayer system on a substrate, as explained previously, wherein the multilayer system has layers made from at least two different materials having a different real part of the refractive index at a wavelength in the extreme ultraviolet wavelength range, which are arranged alternately.

In a second step 603, the measured reflectivity distribution is compared to a target distribution of the reflectivity over the surface of the multilayer system. Depending on the application and the type of the EUV mirror, the target distribution can be optimized for example for incident radiation having an intensity that is inhomogeneous over the surface of the multilayer system being reflected such that the intensity distribution of the reflected radiation is more homogeneous over the surface or optimized for incident radiation having a homogeneous intensity distribution being reflected if possible without the homogeneity of the intensity distribution deteriorating. In this case, the target distribution should fluctuate around an average value by no more than 1%, preferably by no more than 0.5%, with particular preference by no more than 0.1%.

Subsequently, in a third step 605, one or more partial surfaces are determined that have a measured reflectivity that is above the target reflectivity. Said one or more partial surfaces are irradiated with gallium ions in pulsed fashion in a further step 607. In addition to gallium ions, they can also be irradiated in pulsed fashion with indium, bismuth, tin or gold ions or with electrons. On account of the pulsed irradiation, the introduced energy dose can be better controlled. In particular, it is thus more easily possible to ensure that the energy introduction is sufficient to change the structure in the multilayer system at the atomic level, but without promoting any chemical reactions that would lead to a contraction or expansion of the multilayer system and could thereby change the optical properties of the respective reflective optical element.

In particular, the energy of the ions or possibly the electrons during irradiation should advantageously be selected such that it lies below the sputter limit and below the compacting limit. Removal of material of the multilayer system could lead to undesirable changes in optical properties of the EUV mirror, the mask or the mask blank and to an uncontrolled reduction in the reflectivity at the irradiated point. The sputtered material could also result in undesirable contamination of adjacent partial surfaces on the surface of the respective reflective optical element. Depending on the nature of the material, the energy of the ions or electrons can additionally be selected such that no compacting of the irradiated layers takes place during irradiation, such as on account of densification of chemical reactions, but only the sharpness of the interfaces between the individual layers is influenced. Compacting could change the optical properties of the mirror, of the mask blank or of the mask.

In addition, it has proven particularly useful if the one or more partial surfaces are irradiated for correcting the reflectivity with a focused ion or possibly electron beam. In this way, smaller partial surfaces can also be selectively corrected. Commercially available devices that make focused ion beams available offer lateral resolutions of up to 10 nm. Using commercially available electron writers, resolutions down to the subnanometer range can be achieved. It is thus possible to correct the reflectivity of the respective reflective optical element particularly precisely. A particularly homogeneous correction can be achieved when lateral resolutions in the range of a few 10s of nanometers to a few micrometers are used. The highly focused beams can be utilized in particular when microstructures or nanostructures are to be introduced into the respective layer that can act for example as diffractive elements.

In the case of masks, local deviations of the width of the mask structures from the respective target width may occur, manifesting in local variations of the mask CD and possibly resulting in corresponding deviations of the structures on the semiconductor element to be produced, such as a chip. For masks for application in the DUV wavelength range, it is known that such undesirable deviations of the mask structure can be compensated for by a local change in the transmittance of the mask, for example by writing in scattering pixels using a femtosecond laser, as is described for example in WO 2016/042549 A2. The inventors have now found that in masks for the EUV wavelength range, corresponding CD corrections can be achieved by way of a local change in the local reflectivity as described here and the deviation from the CD target value can at least partially be decreased.

It should be pointed out that, even though the present invention was explained here in more detail on the basis of an EUV lithography apparatus, all statements likewise apply as described above to other applications such as to mask or wafer inspection apparatuses with mirrors or optical systems.

REFERENCE NUMERALS

10 EUV lithography apparatus
11 operating beam
12 EUV radiation source
13 collector mirror
14 illumination system
15 first mirror
16 second mirror
17 mask
18 third mirror
19 fourth mirror
20 projection system
21 wafer
50 collector mirror
51 substrate
52 polishing layer
53 protective layer
54 multilayer system
55 pair of layers
56 spacer
57 absorber 58 mask
59 absorbing layer
200 EUV mirror
202 surface
204 area
206 partial surface
500 gallium ion
501 trajectory
560 silicon atom
570 molybdenum atom
601 to 607 method steps

What is claimed is:

1. A method for correcting a reflectivity distribution over a surface of a reflective optical element configured for an extreme ultraviolet (EUV) wavelength range from 5 nm to 20 nm, having a multilayer system on a substrate, wherein the multilayer system has layers made from at least two different materials having different real parts of respective refractive indices at a wavelength in the EUV wavelength range, which are arranged alternately, comprising:
   measuring the reflectivity distribution over the surface of the multilayer system of the reflective optical element;
   comparing the measured reflectivity distribution to a target distribution of the reflectivity over the surface of the multilayer system and determining one or more partial surfaces of the surface having a measured reflectivity that lies above a target reflectivity; and
   irradiating the one or more partial surfaces with ions or electrons to correct the reflectivity distribution of the determined one or more partial surfaces.

2. The method as claimed in claim 1, wherein the target distribution fluctuates around an average distribution by no more than 1%.

3. The method as claimed in claim 1, wherein an energy of the ions or electrons during said irradiating is selected such that the energy lies below a sputter limit and/or below a compacting limit.

4. The method as claimed in claim 1, wherein said irradiating comprises irradiating the one or more partial surfaces with a pulsed ion beam or an electron beam.

5. The method as claimed in claim 1, wherein said irradiating comprises irradiating the one or more partial surfaces with gallium, indium, bismuth, tin or gold ions.

6. A reflective optical element for the wavelength range from 5 nm to 20 nm, comprising:
   the multilayer system on the substrate, wherein the multilayer system has the layers made from at least the two different materials having the different real parts of the refractive index at the wavelength in the EUV wavelength range, which are arranged alternately, corrected as claimed in claim 1 and wherein the one or more partial surfaces with a root-mean-squared roughness of over 0.25 nm lie in surface areas of a higher intensity.

7. The reflective optical element as claimed in claim 6, configured as a mirror, a mask blank or a mask.

8. An optical system comprising the reflective optical element as claimed in claim 6.

9. An EUV lithography apparatus comprising: an optical system having the reflective optical element as claimed in claim 6 and an EUV radiation source, wherein the radiation of the EUV radiation source is incident on the reflective optical element with an intensity that varies over the surface of the multilayer system of the reflective optical element, wherein the one or more partial surfaces with a root-mean-squared roughness of over 0.25 nm lie in surface areas of a higher intensity.

10. An EUV lithography apparatus comprising an optical system having the reflective optical element corrected as claimed in claim 1 and an EUV radiation source, wherein the radiation of the EUV radiation source is incident on the reflective optical element with an intensity that varies over the surface of the multilayer system of the reflective optical element, wherein the one or more partial surfaces irradiated with the ions or the electrons lie in surface areas of a higher intensity.

11. The method as claimed in claim 1, wherein irradiating the one or more partial surfaces includes irradiating a partial area of the layers of the multilayer system, the layers including a spacer layer having a first material and an absorber layer having a second material different from the first material, such that periodicity of the multilayer system is disturbed and the reflectivity is reduced at the partial area.

12. The method as claimed in claim 11, further comprising: based on a number or a concentration of the ions, changing the real parts and imaginary parts of the refractive index at the wavelength of the spacer layer and the absorber layer such that an optical contrast between the spacer layer and the absorber layer is reduced, wherein the first material includes silicon and the second material includes molybdenum.

13. The method as claimed in claim 1, wherein measuring the reflectivity distribution over the surface of the multilayer system includes measuring the reflectivity distribution at the wavelength in the EUV wavelength range.

* * * * *

UNITED STATES PATENT AND TRADEMARK OFFICE
CERTIFICATE OF CORRECTION

PATENT NO.        : 10,809,630 B2  
APPLICATION NO.   : 16/550415  
DATED             : October 20, 2020  
INVENTOR(S)       : Kalden Page 1 of 1

It is certified that error appears in the above-identified patent and that said Letters Patent is hereby corrected as shown below:

In the Specification

Column 1, Line 9, After "Application" insert -- No. --.

Column 1, Line 12, After "Application" insert -- No. --.

Signed and Sealed this  
Twenty-fifth Day of May, 2021

Drew Hirshfeld  
*Performing the Functions and Duties of the*  
*Under Secretary of Commerce for Intellectual Property and*  
*Director of the United States Patent and Trademark Office*